United States Patent [19]

Goetz et al.

[11] Patent Number: 5,326,850
[45] Date of Patent: Jul. 5, 1994

[54] MOLDING MATERIALS BASED ON UNSATURATED COPOLYAMIDES

[75] Inventors: Walter Goetz; Brigitte Gareiss; Andreas Deckers, all of Ludwigshafen; Petra Baierweck, Schifferstadt, all of Fed. Rep. of Germany

[73] Assignee: BASF Aktiengesellschaft, Ludwigshafen, Fed. Rep. of Germany

[21] Appl. No.: 25,864

[22] Filed: Mar. 3, 1993

[30] Foreign Application Priority Data

Mar. 5, 1992 [DE] Fed. Rep. of Germany ....... 4206949

[51] Int. Cl.$^5$ ............... C08G 69/26; C08G 69/08; C08J 3/28
[52] U.S. Cl. ............... 528/345; 528/310; 528/325; 528/323; 528/338; 528/324; 522/164
[58] Field of Search ............... 528/310, 345, 325, 323, 528/338, 324; 522/164

[56] References Cited

U.S. PATENT DOCUMENTS

| | | | |
|---|---|---|---|
| 2,858,259 | 10/1958 | Lawton | 525/164 |
| 2,967,137 | 1/1961 | Lawton | 522/164 |
| 4,465,823 | 8/1984 | Berger | 528/345 |
| 4,716,094 | 12/1987 | Minonishi | 430/284 |

FOREIGN PATENT DOCUMENTS

| | | |
|---|---|---|
| 3037488 | 4/1981 | Fed. Rep. of Germany . |
| 3906684 | 4/1988 | Fed. Rep. of Germany . |
| 7009677 | 9/1963 | Japan . |

OTHER PUBLICATIONS

Lanzetta, N. et al. J. Polym. Sci. 11, 1973 913–923.
CA 78-44353, Carriere, F.
Encyclopedia of Polymer Science and Engineering, J. Wiley and Sons Publishing, N.Y., 1981, vol. 11, pp. 341–343.
P. Corrachini et al., Europ. Polym. J. 12 (7), 463 (1976).
G. Maglio et al. Polymer 17 (3), 185 (1976).

*Primary Examiner*—James J. Seidleck
*Assistant Examiner*—I. Zemel
*Attorney, Agent, or Firm*—Keil & Weinkauf

[57] ABSTRACT

Molding materials are composed of
  A) from 40 to 100% by weight of a copolyamide based on
    a1) from 1 to 20 mol%, based on the copoly- amide, of at least one monomer that contains at least one olefinic double bond (monomers a1) from the group of the
      $\alpha_1$) olefinically unsaturated lactams,
      $\alpha_2$) olefinically unsaturated aminocarboxylic acids,
      $\alpha_3$) olefinically unsaturated dicarboxylic acids,
      $\alpha_4$) olefinically unsaturated diamines, and
    a2) from 80 to 99 mol%, based on the copolyamide, of at least one monomer that contains no olefinic double bonds (monomers a2) from the group of the
      $\beta_1$) lactams
      $\beta_2$) aminocarboxylic acids,
      $\beta_3$) dicarboxylic acids,
      $\beta_4$) diamines, and
  B) from 0 to 35% by weight of an impact modifying rubber,
  C) from 0 to 50% by weight of a filler and/or reinforcing agent,
  D) from 0 to 20% by weight of a flame retardant, and
  E) from 0 to 10% by weight of further additives and processing aids.

7 Claims, No Drawings

MOLDING MATERIALS BASED ON UNSATURATED COPOLYAMIDES

The present invention relates to molding materials comprising

A) from 40 to 100% by weight of a copolyamide based on
   a₁) from 1 to 20 mol%, based on the copoly- amide, of at least one monomer that contains at least one olefinic double bond (monomers a₁) from the group of the
      α₁) olefinically unsaturated lactams,
      α₂) olefinically unsaturated aminocarboxylic acids,
      α₃) olefinically unsaturated dicarboxylic acids,
      α₄) olefinically unsaturated diamines, and
   a₂) from 80 to 99 mol%, based on the copolyamide, of at least one monomer that contains no olefinic double bonds (monomers a₂) from the group of the
      β₁) lactams
      β₂) aminocarboxylic acids,
      β₃) dicarboxylic acids,
      β₄) diamines, and
B) from 0 to 35% by weight of an impact modifying rubber,
C) from 0 to 50% by weight of a filler and/or reinforcing agent,
D) from 0 to 20% by weight of a flame retardant, and
E) from 0 to 10% by weight of further additives and processing aids.

The present invention further relates to the use of the molding materials for producing moldings, fibers or sheetlike structures and to the moldings, fibers and sheetlike structures obtainable from the molding materials. The invention further relates to a process for producing the moldings, fibers and sheetlike structures.

Polyamides having olefinic double bonds in the main chain are known for example from P. Corrachini et al.: Europ. Polym. J., 12 (7), 463 (1976), G. Maglio et al.: Polymer, 17 (3), 185 (1976) and F. Carriere: Bull. Soc. Chim. Fr. 10, 3965 (1972) and have been studied in respect of their physical properties.

It is known from DE-A1-39 06 684 that aromatic polyamide resins that contain olefinic double bonds in the main chain and/or in side chains are crosslinkable by high-energy radiation. But, because of their properties, they are not suitable for many purposes.

It is an object of the present invention to provide polyamide-based molding materials that are suitable for producing moldings or sheetlike structures, readily crosslinkable and notable for uniform product properties and in particular for a high heat deflection temperature.

We have found that this object is achieved by the molding materials of the invention, which are based on copolyamides that contain olefinic double bonds.

According to the invention, these molding materials comprise from 40 to 100% by weight, preferably from 50 to 90% by weight, in particular from 60 to 80% by weight, based on the total weight of the molding material, of these olefinically unsaturated copolyamides (component (A)), from 0 to 35% by weight, preferably from 5 to 25% by weight, in particular from 10 to 20% by weight, based on the total weight of the molding material, of an impact modifying rubber (component (B)), from 0 to 50% by weight, preferably from 10 to 40% by weight, in particular from 15 to 35% by weight, based on the total weight of the molding materials, of filler and reinforcing agent (component (C)), from 0 to 20% by weight, preferably from 5 to 20% by weight, in particular from 5 to 15% by weight, based on the total weight of the molding material, of a flame retardant (component (D)) and from 0 to 10% by weight, preferably 0 to 5% by weight, in particular from 0.5% to 2% by weight, based on the total weight of the molding material, further additives and aids (component (E)).

The copolyamides (A) are based on from 1 to 0 mol%, preferably from 2 to 15 mol%, in particular from to 10 mol%, based on component (A), at least of one monomer (a₁) which has at least one olefinic double bond and belongs to the group of the olefinically unsaturated lactams, aminocarboxylic acids, dicarboxylic acids and diamines. In general, these unsaturated monomers (a₁) do not have more than five, in particular not more than three, olefinic double bonds which, advantageously, are not conjugated with one another. Aside from olefinic double bonds the monomers (a₁) can also contain aromatic double bonds, in which case the olefinic and aromatic double bonds are advantageously not conjugated with one another. Aside from aromatic rings the monomers (a₁) may also contain cycloaliphatic rings. Compounds that contain a double bond alpha to the carbonyl function are less suitable for use as monomers (a₁). Aliphatic compounds having 6 or more carbon atoms and a double bond a to the carbonyl function, however, may be suitable for use as monomers (a₁).

The olefinically unsaturated lactams (a₁), which in general have from 6 to 12, in particular 6 to 7, carbon atoms, include 3-hexenolactam, 4-hexenolactam, 5-hexenolactam, 3-heptenolactam, 4-heptenolactam, 5-heptenolactam, 6-heptenolactam and 5-methyl-4-pentenolactam. It is of course also possible to use mixtures of different unsaturated lactams.

Suitable olefinically unsaturated aminocarboxylic acids (a₂) have in general from 6 to 20, in particular from 6 to 7, carbon atoms. Examples of these compounds are 6-amino-3-hexenoic acid, 16-amino-9-hexadecenoic acid, 18-amino-9,12-octadecadienoic acid, and 20-aminoeicosenoic acid. It is also possible to use mixtures of different unsaturated aminocarboxylic acids.

According to the invention, it is also possible to use olefinically unsaturated dicarboxylic acids (a₃). As a rule, these have from 6 to 30 carbon atoms. Dicarboxylic acids of from 8 to 30 carbon atoms are preferred. They can be linear or branched, preference being given to linear aliphatic dicarboxylic acids. Examples of representatives of these acids are 2-hexene1,6-dicarboxylic acid, 3-hexene-1,6-dicarboxylic acid, 4-octene-1,8-dicarboxylic acid and 5-carboxyl-9-decanoic acid. Long-chain dicarboxylic acids having from 12 to 30 carbon atoms are particularly preferred which, for example, are obtainable from fatty acid esters by means of metathesis reactions. They include 9-octadecene1,18-dicarboxylic acid (preparable for example from oleic acid) and 10-eicosene-1,20-dicarboxylic acid (preparable from ricinoleic acid). Other possibilities are 9,12-tetracosadiene-1,24-dicarboxylic acid, 9,12-heneicosadiene-1,21-dicarboxylic acid, 9,12,15tetracosatriene-1,24-dicarboxylic acid and 9,12,15,18heptacosatetraene1,24-dicarboxylic acid, which are all prepared from oleic, linoleic and linolenic acid mixtures, and 9-nonadecene-1,19-dicarboxylic acid, 9,12-docasadiene1,22-dicarboxylic acid and 9,12,15-pentacosatriene1,25-dicarboxylic acid, which are all available from oleic and ricinoleic acid mixtures. A preferred unsaturated dicarboxylic acid is 9-octadecene-1,18-dicarboxylic acid. Very particular preference is given to 3-hexene-1,6-dicarboxylic acid, 4-octene-1,8-dicarboxylic acid and 10-eicosene-1,20-dicarboxylic acid. Not only individual compounds but also mixtures of different unsaturated dicarboxylic acids can be used.

Suitable monomers ($a_1$) for the purposes of the invention also include olefinically unsaturated diamines ($a_4$). These diamines can be not only linear but also branched. They have in general from 4 to 20, preferably from 6 to 18, in particular from 6 to 12, carbon atoms and belong for example to the group consisting of 1,4-diamino-2-butene, 1,5-diamino-2-pentene, 1,6-diamino-2-hexene, 1,6-diamino-3-hexene, 2,7-diamethyl-4-octene, 1,9-diamino-2,7-nonadiene, and 1,10-diamino-2,8-decadiene. Preferred unsaturated diamines are 1,6-diamino-2-hexene, 1,6-diamino-3-hexene and 2,7-diamino-2,7-dimethyl-4-octene. It is also possible to use mixtures of different unsaturated diamines.

The copolyamides (A) of the molding materials according to the invention contain from 80 to 99 mol%, preferably from 85 to 98 mol%, in particular from 90 to 98 mol%, based on component (A), of units derived from monomers ($\beta$) which do not contain any olefinic double bonds. However, these monomers ($\beta$) may contain aromatic double bonds. Suitable monomers ($\beta$) are compounds from the group of the lactams, aminocarboxylic acids, dicarboxylic acids and diamines or mixtures thereof.

The lactams ($\beta_1$) have in general from 5 to 12 carbon atoms. Representatives of these monomers are δ-valerolactam, ε-caprolactam, enantholactam, capryllactam and laurolactam. As well as the individual compounds it is also possible to use mixtures of two or more different lactams.

Aminocarboxylic acids ($\beta_2$) having in general from 4 to 20, preferably from 5 to 12, carbon atoms, such as 5-aminopentanoic acid, 6-aminohexanoic acid, 7-aminoheptanoic acid, 8-aminooctanoic acid, 11-aminoundecanoic acid and mixtures of different aminocarboxylic acids are suitable for use as monomers ($\beta$).

The dicarboxylic acids ($\beta_3$) include not only aromatic but also aliphatic ones. Aromatic dicarboxylic acids preferably have from 8 to 16, in particular from 8 to 10, carbon atoms and are for example isophthalic acid, terephthalic acid, substituted isophthalic and terephthalic acids such as 3-t-butylisophthalic acid or phenoxyterephthalic acid, polycyclic dicarboxylic acids, eg. 4,4'-biphenyldicarboxylic acid, 3,3'-biphenyldicarboxylic acid, 3,3'-diphenylmethanedicarboxYlic acid, 4,4'-diphenylmethanedicarboxylic acid, 3,3'-sulfodiphenyldicarboxylic acid, 4,4'-sulfodiphenyldicarboxylic acid, 1,4-naphthalenedicarboxylic acid and 2,6-naphthalenedicarboxylic acid, of which terephthalic acid and isophthalic acid are particularly preferred. Representatives of suitable aliphatic dicarboxylic acids, which in general have from 4 to 20 carbon atoms, advantageously from 6 to 16 carbon atoms, are adipic acid, suberic acid, azetaic acid, sebacic acid and 1,12-dodecanedioic acid. Adipic acid is particularly preferred. Mixtures of different dicarboxylic acids can also be used.

Suitable dialnines ($\beta_4$) have in general from 4 to 20, preferably from 6 to 12, carbon atoms. 1,4-Diaminobutane, 1,5-diaminopentane, 1,6-diaminohexane, piperazine, 4,4'-diaminodicyclohexylmethane, 2,2-(4,4'-diaminodicyclohexyl)propane and 3,3'-dimethyl-4,4'-diaminodicyclohexylmethane are examples of diamines which can be used as monomers ($\beta_4$). In addition to aliphatic and cycloaliphatic diamines it is also possible to use diamines which contain aromatic rings, such as m-xylylenediamine. It is also possible to use mixtures of two or more different diamines.

The copolyamides of the invention can be prepared by combining different monomers ($\alpha$) and ($\beta$). It will be readily understood that the amine and carboxylic acid equivalents should be used approximately in a ratio of 1:1. Examples of such mixtures are olefinically unsaturated lactams ($\alpha_1$) with lactams ($\beta_1$)

olefinically unsaturated dicarboxylic acids ($\alpha_3$) with diamines ($\beta_4$)

olefinically unsaturated diamines ($\alpha_4$) with dicarboxylic acids ($\beta_3$).

Particular preference is given to the mixtures of olefinically unsaturated dicarboxylic acids ($\alpha_3$) with dicarboxylic acids ($\beta_3$) and with dialnines ($\beta_4$)

olfinically unsaturated dicarboxylic acids ($\alpha_3$) with lactams ($\beta_1$) and with diamines ($\beta_4$).

Very particular preference is given to the two last-mentioned mixtures when ε-caprolactam is used as ($\beta_1$), adipic acid as ($\beta_3$) and 1,6-diaminohexane as ($\beta_4$).

Preferred olefinically unsaturated dicarboxylic acids ($\alpha_3$) in these mixtures are 3-hexenedicarboxylic acid, 4-octenedicarboxylic acid and 10-eicosenedicarboxylic acid. Preferred mixtures also contain olefinically unsaturated dieunines ($\alpha_4$) in particular 1,6-diamino-3-hexene or 2,7-diamino-2,7-dimethyl-4-octene or mixtures thereof.

The copolyamides (component A) can be prepared using not only batchwise but also continuous methods. For preparing homopolyamides or copolyamides which in addition to olefinic double bonds also contain aromatic units and whose units are wholly or partly obtainable from dicarboxylic acids it is particularly advantageous first to prepare prepolymers at about 200–400° C. under superatmospheric pressure within short residence times and then to postcondense them in solid phase or in the melt to the final viscosity. The short residence times make it possible to suppress secondary reactions such as self-condensation of diamines to form triamines.

Rubber component (B) of the molding materials, which may be present therein in an amount of up to 35% by weight, in particular from 10 to 20% by weight, is preferably present therein in an amount of from 5 to 25% by weight, based on the total weight of the molding materials. This rubber component (B) is in general a copolymer formed preferably of at least two of the following monomers as main components: ethylene, propylene, isobutene, isoprene, chloroprene, vinyl acetate, styrene, acrylonitrile and acrylic and methacrylic esters having from 1 to 18 carbon atoms in the alcohol component.

Rubbers of this kind are described for example in Houben-Weyl, Methoden der organischen Chemie, volume 14/1 (Thieme-Verlag, Stuttgart 1961), pages 392 to 406, and the monograph by C. B. Bucknail, Toughened Plastics, (Applied Science Publishers, London 1977).

Preferred kinds of elastomers of this type are the ethylene-propylene monomer (EPM) rubbers and ethylene-propylene-diene monomer (EPDM) rubbers, which preferably have an ethylene to propylene unit ratio within the range from 40:60 to 90:10.

The Mooney viscosities (ML1+4/100° C.) of such uncrosslinked EPM or EPDM rubbers (gel contents in general below 1% by weight) are preferably within the range from 25 to 100, in particular from 35 to 90 (measured with the large rotor after 4 minutes at 100° C. in accordance with German Standard Specification DIN 53 523).

EPM rubbers have in general virtually no double bonds left over, while EPDM rubbers may have from 1 to 20 double bonds/100 carbon atoms.

Suitable diene monomers for EPDM rubbers are for example conjugated dienes such as isoprene, nonconjugated dienes of from 5 to 25 carbon atoms such as 1,4-pentadiene, 1,4-hexadiene, 1,5-hexadiene, 2,5-dimethyl1,5-hexadiene and 1,4-octadiene, cyclic dienes such as cyclopentadiene, cyclohexadienes cyclooctadienes and dicyclopentadiene and also alkenylnorbornenes such as 5-ethylidene-2-norbornene, 5-butylidene-2-norbornene, 2-methallyl-5-norbornene, 2-isopropenyl-5-norbornene and tricyclodienes such as 3-methyltricyclo[5.2.1.0.2.6]-3,8-decadiene or mixtures thereof. Preference is given to 1,5-hexadiene, 5-ethylidenenorbornene and dicyclopentadiene. The diene content of the EPDM rubbers is preferably from 0.5 to 50, in particular from 1 to 8, % by weight, based on the total weight of rubber.

EPM and EPDM rubbers can preferably also be grafted with reactive carboxylic acids or derivatives thereof. These include for example acrylic acid, methacrylic acid and derivatives thereof and also maleic anhydride.

A further group of preferred rubbers are copolymers of ethylene with acrylic and/or methacrylic acid and/or the esters of these acids. In addition, the rubbers may contain dicarboxylic acids such as maleic acid and fumaric acid or derivatives thereof, such as esters and anhydrides, and/or epoxy-containing monomers. These dicarboxylic acid derivatives and epoxy-containing monomers are preferably incorporated in the rubber by adding dicarboxylic acid- or epoxy-containing monomers of the general formula II or III or IV or V to the monomer mixture

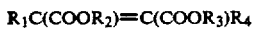

$R_1C(COOR_2)=C(COOR_3)R_4$    II

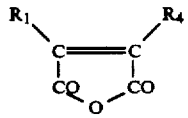

III

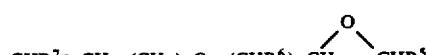

IV

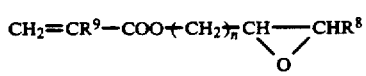

V where $R^1$ to $R^9$ are each hydrogen or alkyl of from 1 to 6 carbon atoms, m is an integer from 0 to 20, n is an integer from 0 to 10 and p is an integer from 0 to 5.

Preferably, each of $R^1$-$R^7$ is hydrogen, m is 0 or 1, and n is 1. The corresponding compounds are maleic acid, fumaric acid, maleic anhydride, allyl glycidyl ether and vinyl glycidyl ether.

Preferred compounds of the formulae II, III and V are maleic acid, maleic anhydride and epoxy-containing esters of acrylic acid and/or methacrylic acid, of which glycidyl acrylate, glycidyl methacrylate and the esters with tertiary alcohols, such as t-butyl acrylate, are particularly preferred. It is true that the latter have no free carboxyl groups, but their behavior is similar to that of the free acids and therefore they are referred to as monomers having latent carboxyl groups.

The ethylene content of the copolymers is in general within the range of from 50 to 98% by weight, and the proportion of methacrylic esters is within the range of from 2 to 50% by weight. The copolymers can advantageously consist of from 50 to 98% by weight of ethylene, from 0.1 to 20% by weight of epoxy-containing monomers and/or methacrylic acid and/or monomers containing anhydride groups, and methacrylic esters as remainder.

Particular preference is given to copolymers of
from 50 to 98, in particular from 60 to 95, % by weight of ethylene
from 0.1 to 40, in particular from 0.3 to 20, % by weight of glycidyl acrylate and/or glycidyl methacrylate, acrylic acid and/or maleic anhydride, and
from 1 to 45, in particular from 10 to 35, % by weight of n-butyl acrylate and/or 2-ethylhexyl acrylate.

Further preferred esters of acrylic and/or methacrylic acid are the methyl, ethyl, propyl, i-butyl and t-butyl esters.

In addition it is possible to use vinyl esters and vinyl ethers as comonomers.

The above-described ethylene copolymers can be prepared in a conventional manner, preferably by random copolymerization at elevated temperature and pressure. Appropriate methods are common knowledge.

The melt index of the ethylene copolymers is in general within the range from 1 to 80 g/10 min (measured at 190° C. under a load of 2.16 kg).

Further preferred elastomers (B) are emulsion polymers whose preparation is described for example in Houben-Weyl, Methoden der organischen Chemie, volume XII. I (1961) and also in Blackley's monograph, Emulsion Polymerization. Usable emulsifiers and catalysts are known per se.

In principle, it is possible to use elastomers with a homogeneous structure or elastomers with a shell structure. The shell-like structure is determined by the order of addition of the individual monomers; the order of addition also has a bearing on the morphology of the polymer.

Merely representative examples of monomers for preparing the rubber part of the elastomers are acrylates, eg. n-butyl acrylate or 2-ethylhexyl acrylate, the corresponding methacrylates and isoprene and also mixtures thereof. These monomers can be copolymerized with further monomers such as, for example, styrene, acrylonitrile, vinyl ethers and further acrylates or methacrylates such as methyl methacrylate, methyl acrylate, ethyl acrylate and propyl acrylate.

The soft or rubber phase (having a glass transition temperature of below 0° C.) of the elastomers can represent the core, the outer sheath or an intermediate shell (in the case of elastomers having more than two shells); in the case of multishell elastomers it is also possible for more than one shell to be made of a rubber phase.

If in addition to the rubber phase one or more hard components (having glass transition temperatures of more than 20° C.) are involved in the formation of the elastomer, they are in general prepared by polymerization of styrene, acrylonitrile, methacrylonitrile, α-methylstyrene, p-methylstyrene, acrylic esters and methacrylic esters such as methyl acrylate, ethyl acrylate and methyl methacrylate as principal monomers. Again, here too, minor amounts of further comohomers can be used.

In some cases it will be advantageous to use emulsion polymers which have reactive groups at the surface. Such groups are for example epoxy, carboxyl, latent carboxyl, amino or amide groups and also functional groups which can be introduced by using monomers of the general formula VI

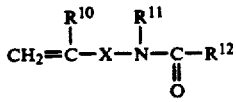 VI where the substituents can have the following meanings:
$R^{10}$ is hydrogen or $C_1-C_4$-alkyl,
$R^{11}$ is hydrogen, $C_1-C_8$-alkyl or aryl, in particular phenyl,
$R^{12}$ is hydrogen, $C_1-C_{10}$-alkyl, $C_8-C_{12}$-aryl or $-OR^{13}$,
$R^{13}$ is $C_1-C_8$-alkyl or $C_6-C_{12}$-aryl, which may each be substituted by O- or N-containing groups,
X is a chemical bond, $C_1-C_{10}$-alkylene, $C_6-C_{12}$-arylene or

Y is O—Z— or NH—Ż— and
Z is $C_1-C_{10}$-alkylene or $C_6-C_{12}$-arylene.

It is also possible to use the graft monomers described in EP-A-208 187 for introducing reactive groups at the surface.

Further examples are acrylamide, methacrylamide and substituted esters of acrylic acid or methacrylic acid such as (N-t-butylamino)ethyl methacrylate, (N,N-dimethylamino)ethyl acrylate, (N,N-dimethylamino)-methyl acrylate and (N,N-diethylamino)ethyl acrylate.

Furthermore, the particles of the rubber phase may also be crosslinked. Crosslinking monomers are for example divinylbenzene, diallyl phthalate and dihydrodicyclopentadienyl acrylate and also the compounds described in EP-A-50 265.

Furthermore, it is also possible to use graft-linking monomers, is. monomers having two or more polymerizable double bonds which react at different rates during the polymerization. Preference is given to those compounds in which at least one reactive group polymerizes at substantially the same rate as the other monomers, while the other reactive group or groups polymerizes or polymerize for example at a distinctly slower rate. The different polymerization rates introduce a certain proportion of unsaturated double bonds into the rubber. If such a rubber is subsequently grafted with a further phase, the double bonds present in the rubber react at least partly with the graft monomers to form chemical bonds, so that the grafted-on phase ends up being linked at least to some extent to the grafting base via chemical bonds.

Examples of such graft-linking monomers are allyl-containing monomers, in particular allyl esters of ethylenically unsaturated carboxylic acids such as allyl acrylate, allyl methacrylate, diallyl maleate, diallyl fumarate, diallyl itaconate or the corresponding monoallyl compounds of these dicarboxylic acids.

There are many other suitable graft-linking monomers; for details reference is made to U.S. Pat. No. 4,148,846 by way of example.

In general, the proportion of these crosslinking monomers in component (B) is up to 5% by weight, preferably not more than 3% by weight, based on (B).

There now follows a list of some preferred emulsion polymers. The first group comprises graft polymers having a core and at least one outer shell which have the following structure:

| Type | Monomers for core | Monomers for sheath |
|------|-------------------|---------------------|
| $M_1$ | Isoprene, n-butyl acrylate ethylhexyl acrylate or mixtures thereof | styrene, acrylonitrile, methyl methacrylate |
| $M_2$ | as for $M_1$ but with the use of crosslinkers | as for $M_1$ |
| $M_3$ | as for $M_1$ or $M_2$ | n-butyl acrylate, ethyl acrylate, methyl acrylate isoprene, ethyl-hexyl acrylate |
| $M_4$ | as for $M_1$ or $M_2$ | as for $M_1$ or $M_3$ but with the use of monomers having reactive groups as described herein |
| $M_5$ | styrene, acrylonitrile, methyl methacrylate or mixtures thereof | first sheath made of monomers as described under $M_1$ and $M_2$ for the core second sheath as described under $M_1$ or $M_3$ for the sheath |

Instead of graft polymers having a multishell structure it is also possible to use homogeneous, ie. single-shell, elastomers formed of isoprene and n-butyl acrylate or copolymers thereof. These products too can be prepared using crosslinking monomers or monomers having reactive groups.

Example of preferred emulsion polymers are n-butyl acrylate/(meth)acrylic acid copolymers, n-butyl acrylate/glycidyl acrylate or n-butyl acrylate/glycidyl methacrylate copolymers, graft polymers having an inner core of n-butyl acrylate and an outer sheath of the aforementioned copolymers and copolymers of ethylene with comonomers which provide reactive groups.

The above-described elastomers (B) can also be prepared by other customary methods, for example by suspension polymerization.

It is of course also possible to use mixtures of the aforementioned types of rubber.

The molding materials of the invention may contain from 0 to 50% by weight, preferably from 10 to 40% by weight, in particular from 15 to 35% by weight, based on the total weight of the molding materials, of fibrous or particulate fillers or reinforcing agents or mixtures thereof as component (C).

Examples of fibrous fillers are glass fibers, carbon fibers, aramid fibers, potassium titanate fibers and fibrous silicates such as wollastonite. Particular preference is given to using glass fibers and wollastonite.

If carbon or glass fibers are used, they can be dressed with a size and adhesion promoter to improve their compatibility with the copolyamide.

In general, the glass fibers used have a diameter within the range from 6 to 20 μm. Since the average length of the glass fibers will shorten in the course of processing, the glass fibers can be introduced not only in the form of continuous strands (rovings) but also as staple fiber in general about 1–10 mm in length or as chopped fiber about 0.05–1.5 mm in length. After processing, the average fiber length is in general within the range from 0.05 to 5 mm.

Suitable particulate fillers are for example glass balls, quartz powder, boron nitride, kaolin, calcium carbonate, mica, magnesium carbonate (chalk) and titanium dioxide, of which titanium dioxide and kaolin are in general preferred.

The molding materials of the invention may further contain flame retardants as component (D) in amounts of from 0 to 20, preferably from 5 to 20, % by weight, in particular from 5 to 15% by weight, based on the total weight of the molding materials.

It is possible to use any known flame retardant, eg. polyhalogenated biphenyl, polyhalogenated diphenyl ether, polyhalogenated phthalic acid and derivatives thereof, polyhalogenated oligocarbonates and polycarbonates, of which the bromine compounds are particularly effective.

Examples thereof are polymers of 2,6,2',6'-tetrabromobisphenol A, of tetrabromophthalic acid, of 2,6-dibromophenol and 2,4,6-tribromophenol and derivatives thereof.

Further halogen-containing flame retardants are tetrabromobenzene, hexachlorobenzene, and hexabromobenzene, and also halogenated polystyrenes and polyphenylene ethers. Similarly, halogenated phthalimides can be used. Of these, in particular N,N'-ethylenebistetrabromophthalimide has become important.

The preferred flame retardant (D) is elemental red phosphorus, in particular when the molding materials are reinforced with glass fiber.

Although it is possible to use untreated red phosphorus, preference is given to flame retardants in which the phosphorus has been surface coated with low molecular weight liquid substances such as silicone oil, paraffin oil or esters of phthalic acid or adipic acid or with polymeric or oligomeric compounds, for example with phenolic resins, amino resins or polyurethanes.

As flame retardants it is also possible to use concentrates of red phosphorus, for example in a polyamide or elastomer, in particular in polyolefin homopolymers and copolymers. Preference is given to using concentrates having a very high phosphorus content. In general, the phosphorus content of the concentrate is not less than 30% by weight, based on the weight of the concentrate.

The median particle size ($d_{50}$) of the phosphorus particles dispersed in the molding materials is preferably within the range from 0.0001 to 0.5 mm, in particular from 0.001 to 0.2 mm.

Suitable phosphorus compounds for use as flame retardants are organophosphorus compounds such as phosphonates, phosphinates, phosphinites, phosphine oxides, phosphines, phosphites or phosphates. An example is triphenylphosphine oxide. It can be used alone or mixed with hexabromobenzene or a chlorinated biphenyl or red phosphorus and, optionally, antimony oxide.

Typical preferred phosphorus compounds which can be used according to the present invention are those of the following general formula:

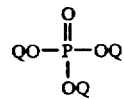

where Q is hydrogen or identical or different hydrocarbyl or halohydrocarbyl, such as alkyl, cycloalkyl, aryl, alkyl-substituted aryl and aryl-substituted alkyl, provided that at least one of the radicals Q is aryl. Examples of suitable phosphates of this type are the following: phenyl bisdodecyl phosphate, phenyl bisneopentyl phosphate, phenylethylene hydrogenphosphate, phenyl bis(3,5,5'-trimethylhexyl) phosphate, ethyl diphenyl phosphate, 2-ethylhexyl di(p-tolyl) phosphate, diphenyl hydrogenphosphate, bis(2-ethylhexyl) phenyl phosphate, tri(nonylphenyl) phosphate, phenyl methyl hydrogenphosphate, di(dodecyl) p-tolyl phosphate, tricresyl phosphate, triphenyl phosphate, dibutyl phenyl phosphate and diphenyl hydrogenphosphate. Preferred phosphates are those in which Q is aryl. The most preferred phosphate is triphenyl phosphate. Furthermore, the combination of triphenyl phosphate with hexabromobenzene and antimony trioxide is preferred.

Suitable flame retardants also include those compounds which contain phosphorus-nitrogen bonds, such as phosphononitrile chloride, amides of phosphoric esters, amines of phosphoric esters, phosphoramides, phosphonamides, phosphinamides, tris(aziridinyl)phosphine oxide and tetrakis(hydroxymethyl)phosphonium chloride. These flame retardant additives are mostly commercially available.

As well as the essential components the molding materials of the invention may contain additives and processing aids (component (E)). The proportion thereof is in general up to 10% by weight, preferably up to 5% by weight, in particular from 0.5 to 2% by weight, based on the total weight of the molding material.

Additives which have been customarily used are for example antioxidants, thermal stabilizers, UV stabilizers, colorants, dyes, pigments, plasticizers, lubricants and demolders and also synergists for flame retardants.

Antioxidants and thermal stabilizers which can be added to the thermoplastic materials of the invention are for example halides of metals of group I of the Periodic Table, for example sodium, potassium, and lithium halides, with or without copper(I) halides, for example chlorides, bromides or iodides. It is also possible to use zinc fluoride and zinc chloride. Other possibilities are sterically hindered phenols, anti-drip agents, eg. polytetrafluoroethylene, hydroquinones, substituted representatives of this group and mixtures thereof, preferably in concentrations of up to 1% by weight based on the weight of the mixture.

Other possibilities, in particular for polyamide mixtures (A) which as well as the olefinic double bonds also contain aromatic units, are stabilizers based on aromatic secondary amines such as diphenylamine and derivatives thereof.

Examples of UV stabilizers are various substituted resorcinols, salicylates, benzotriazoles, benzophenones and also sterically hindered amines which in general are used in amounts of up to 2% by weight.

Lubricants and demolders, which in general are added to the molding material in amounts of up to 1% by weight, are for example long-chain fatty acids, such as palmitic acid or stearic acid, and their salts or alkyl esters and N-alkylamides, long-chain alcohols such as stearyl alcohol and also esters of pentaerythritol with long-chain fatty acids.

Additives also include synergists for flame retardants, such as stabilizers which prevent the decomposition of red phosphorus in the presence of moisture and atmospheric oxygen. Examples are compounds of cadmium, of zinc, of aluminum, of silver, of iron, of copper, of antimony, of tin, of magnesium, of manganese, of vanadium, of boron or of titanium. Particularly suitable compounds are for example oxides of said metals, also carbonates or oxicarbonates, hydroxides and also salts of organic or inorganic acids such as acetates, phosphates, hydrogen phosphates and sulfates.

The molding materials of the invention can be prepared for example in a conventional manner by mixing the starting components in customary mixers such as screw extruders, preferably twin-screw extruders, Brabender mills or Banbury mills or headers, and then extruding the mixture. After extrusion, the extrudate is cooled down and comminuted.

To obtain a homogeneous molding material, intensive mixing is advantageous. This in general requires average mixing times of from 0.2 to 30 minutes at from 28020 to 380° C. The order of mixing in the components can be varied and two or if desired three components can be premixed, but it is also possible to mix all the components together.

The molding materials thus obtained can be used to produce moldings or sheetlike structures such as fibers or films, for which for example known processes such as extrusion or injection molding can be used. The moldings or sheetlike structures can afterwards be exposed to high-energy radiation to crosslink the molding material of which they are made. In general, the crosslinked products contain fewer than 50%, in particular fewer than 30%, of the original olefinic double bonds. High-energy radiation for the purposes of the present invention is for example beta, gamma and X-rays or electron beams. The form of radiation is selected according to the desired depth of penetration into the material. UV radiation, which does not penetrate deeply into the partly crystalline and hence non-transparent moldings, is unsuitable. Preference is given to using electron beams of 20 to 200, in particular from 50 to 100, kGy. The electron beams can be generated for example by means of van der Graaf generators with acceleration voltages of from 300 to 3000, preferably from 800 to 2000, keY; the higher the energy, the deeper the possible penetration into the shaped article.

The total irradiation time is in general within the range from 1 to 60, preferably from 5 to 30, s. The moldings or sheetlike structures can be irradiated uninterruptedly or repeatedly for a shorter period until the desired total irradiation time has been achieved. Using electron beams it is usually possible to cure parts up to about 20 cm, preferably 10 cm, in thickness. This corresponds to a depth of penetration of about 10 or 5 cm respectively in the case of irradiation from both sides.

It is also possible to expose the moldings or sheetlike structures to gamma radiation produced by radioactive nuclides. Gamma rays will produce a penetration depth of several meters, so that the thickness of the parts to be crosslinked is virtually unlimited. The irradiation times in the case of gamma radiation generally range from 0.1 to 100 hours, preferably from 1 to 20 hours.

The crosslinked products are notable in particular for a very high heat deflection temperature. Moldings, fibers or films produced by the process of the invention are therefore particularly suitable for use in fields where they have to withstand high thermal stresses, for example in electronics.

EXAMPLES

Abbreviations

AA adipic acid
HMD hexamethylenediamine
CL ε-caprolactam
HDA 3-hexenedicarboxylic acid
OA 4-octene-1,8-dicarboxylic acid
DDO 2,7-diamino-2,7-dimethyl-4-octene
EA 10-eicosene-1,20-dicarboxylic acid

METHOD

Example 1a 144 g (1 mol) of HDA and 116 g (1 mol) of HMD were dissolved in 300 ml of hot water. Cooling brought down crystals of a 1:1 HDA-HMD adduct. The same method was used to prepare a reaction product of AA and HMD.

A 1 l laboratory autoclave was charged with 13 g of HDA-HMD, 118 g of AA-HMD and 20 g of water. The autoclave was then heated to 280° C. in the course of an hour while the pressure, once it had attained 20 bar, was kept constant by letting down steam. This was followed by condensation at 280° C. and 20 bar for a further 2 hours. Then the autoclave was continuously depressurized to atmospheric in the course of 2 hours. The product thus obtained was discharged, extruded, granulated and dried at 80° C. under reduced pressure for 8 hours.

Examples 1b to 5

These polyamides were prepared in accordance with the above method, and caprolactam-containing products were extracted three times with hot water at 90° C. for 8 hours at a time after the condensation.

Irradiation of Moldings 1 to 5

The injection molded specimens (10×10×3 nun) were irradiated from one side with a dose of 100 kGy produced with a van der Graaf generator using an acceleration voltage of 3 MV. The specimens were each irradiated three times for 10 s with 5 min intervals between the irradiation passes. The irradiation was carried out at room temperature. On irradiation the temperature of the specimens rose to about 60° C.

TESTS

The viscosity number VN of unirradiated samples was determined on 0.5% solutions in 96% sulfuric acid in accordance with ISO 307.

A measure of the degree of crosslinking achieved by the process of irradiation is the proportion of insolubles that remains on extraction of the solubles from the irradiated sample. To determine the insolubles, samples were shaved off (thickness not more than 0.02 mm, weight about 0.2 g) or cut off with a very large surface area (weight about 1.0 g) and weighed to an accuracy of 1 rag. The samples were then extracted with formic acid (50 ml in the case of the shaved samples, 150 ml in the case of the cut samples) for 6 hours. The solution was then removed and the insoluble matter was collected, dried and weighed.

The heat deflection temperature before and after irradiation was determined on compression molded specimens (10×10×3 mm) in accordance with DIN 53 460. For this the specimens were heated in an oil bath, which could be heated to a maximum of 250° C. and weighted with 10 N (Vicat A), and the temperature was measured when the weight had penetrated by 1 mm.

The particular compositions and the results of the tests are shown in the Table.

TABLE

| | Composition of samples and measured results | | | | Vicat A | |
|---|---|---|---|---|---|---|
| Example No. | Composition [mol %] | | | $VN^{1)}$ [ml/g] | Insoluble matter$^{2)}$ [%] | before irradi- [°C.] | after irradi- [°C.] |
| 1C* | — | 100 AA/HMD | — | 149 | 0 | 245 | 244 |
| 1a | 2 HDA/HMD | 98 AA/HMD | — | 155 | 1.5 | 243 | 249 |
| 1b | 5 HDA/HMD | 95 AA/HMD | — | 144 | 10 | 224 | >250 |
| 1c | 10 HDA/HMD | 90 AA/HMD | — | 142 | 22 | 192 | >250 |
| 1d | 20 HDA/HMD | 80 AA/HMD | — | 135 | 40 | 178 | >250 |
| 2C* | — | — | 100 CL | 155 | 0 | 217 | 215 |
| 2a | 2 HDA/HMD | — | 98 CL | 139 | 0.5 | 215 | 235 |
| 2b | 10 HDA/HMD | — | 90 CL | 160 | 14 | 199 | >250 |
| 3a | 10 AA/DDO | 90 AA/HMD | — | 133 | 20 | 209 | 239 |
| 3b | 20 AA/DDO | 80 AA/HMD | — | 129 | 39 | 196 | >250 |
| 3c | 10 AA/DDO | — | 90 CL | 140 | 28 | 176 | 230 |
| 4 | 10 OA/HMD | 90 AA/HMD | — | 141 | 15 | 201 | 249 |
| 5 | 10 EA/HMD | 90 AA/HMD | — | —$^{3)}$ | 52 | 175 | >250 |

*For comparison
$^{1)}$before irradiation
$^{2)}$after irradiation
$^{3)}$not measurable

We claim:

1. A process for producing structures, which comprises (1) molding a copolyamide molding material consisting essentially of:
   A) from 40 to 100% by weight of a copolyamide based on
      $a_1$) from 1 to 20 mol%, based on the copolyamide, of at least one monomer that contains at least one olefinic doubles bond, selected from the group consisting of
         $\alpha_1$) olefinically unsaturated lactams,
         $\alpha_2$) olefinically unsaturated aminocarboxylic acids,
         $\alpha_3$) olefinically unsaturated discarboxylic acids, and
         $\alpha_4$) olefinically unsaturated diamines
      and
      $a_2$) from 80 to 90 mol%, based on the copolyamide, of at least one monomer that contains no olefinic double bonds, selected from the group consisting of
         $\beta_1$) lactams,
         $\beta_2$) aminocarboxylic acids,
         $\beta_3$) dicarboxylic acids, and
         $\beta_4$) diamines
      and
   B) from 0 to 35% by weight of an impact modifying rubber,
   C) from 0 to 50% by weight of a filler or reinforcing agent,
   D) from 0 to 20% by weight of a flame retardant, and
   E) from 0 to 10% by weight of further additives and processing aids and (2) exposing the molded material to high-energy radiation.

2. A structure prepared by a process recited in claim 1.

3. A structure as defined in claim 9 wherein the monomer ($a_1$) is an olefinically unsaturated dicarboxylic acid or a mixture of different unsaturated dicarboxylic acids and the monomers ($a_2$) are adipic acid and hexamethylenediamine.

4. A structure as defined in claim 2 wherein the monomer ($a_1$) is an olefinically unsaturated dicarboxylic acid or a mixture of different unsaturated dicarboxylic acids and the monomers ($a_2$) are hexamethylenediamine and ε-caprolactam.

5. A structure as defined in claim 2 wherein the olefinically unsaturated dicarboxylic and ($\alpha_3$) is 3-hexene-1,6-dicarboxylic acid, 4-octene-1,8-dicarboxylic acid, 10-eicosene-1,20-dicarboxylic acid or a mixture thereof.

6. A structure as defined in claim 2 wherein the olefinically unsaturated diamine ($\alpha_4$) is 3-hexene-1,6-diamine or 2,7-diamino-2,7-dimethyl-4-octene or a mixture thereof.

7. A structure as defined in claim 2 wherein the high-energy radiation is beta-, gamma-, x-radiation or electron beam radiation.

* * * * *

UNITED STATES PATENT AND TRADEMARK OFFICE
CERTIFICATE OF CORRECTION

PATENT NO.: 5,326,850

DATED: July 5, 1994

INVENTOR(S): GOETZ et al.

It is certified that error appears in the above-identified patent and that said Letters Patent is hereby corrected as shown below:

Title page, item [57], line 15 of the Abstract, "a2" should read --$a_2$--.

Column 13, claim 1, line 37, "doubles" should read --double--.

Column 13, claim 1, line 43, "discarboxylic" should read --dicarboxylic--.

Column 13, claim 1, line 54, after "and" insert the following:

--B) from 0 to 35% by weight of an impact modifying rubber,
C) from 0 to 50% by weight of a filler or reinforcing agent,--

Column 14, claim 3, line 33, "9" should read --2--.

Column 14, claim 5, line 44, "and" should read --acid--.

Signed and Sealed this

Fifteenth Day of November, 1994

Attest:

BRUCE LEHMAN

Attesting Officer     Commissioner of Patents and Trademarks